US007323156B2

(12) United States Patent
Vagarali et al.

(10) Patent No.: US 7,323,156 B2
(45) Date of Patent: *Jan. 29, 2008

(54) HIGH PRESSURE/HIGH TEMPERATURE PRODUCTION OF COLORLESS AND FANCY-COLORED DIAMONDS

(75) Inventors: Suresh Shankarappa Vagarali, Columbus, OH (US); Steven William Webb, Worthington, OH (US); William Edwin Jackson, Cleveland, OH (US); William Frank Banholzer, Niskayuna, NY (US); Thomas Richard Anthony, Schenectady, NY (US); George Rene Kaplan, Rye Brook, NY (US)

(73) Assignee: Bellataire International, LLC, Worthington, OH (US)

( * ) Notice: Subject to any disclaimer, the term of this patent is extended or adjusted under 35 U.S.C. 154(b) by 237 days.

This patent is subject to a terminal disclaimer.

(21) Appl. No.: 10/737,541

(22) Filed: Dec. 15, 2003

(65) Prior Publication Data
US 2004/0146451 A1    Jul. 29, 2004

Related U.S. Application Data

(63) Continuation of application No. 10/338,136, filed on Jan. 8, 2003, now Pat. No. 6,692,714, which is a continuation-in-part of application No. 09/162,206, filed on Sep. 28, 1998, now abandoned, and a continuation-in-part of application No. 08/966,642, filed on Nov. 10, 1997, now abandoned, which is a continuation-in-part of application No. 08/953,701, filed on Oct. 17, 1997, now abandoned.

(51) Int. Cl.
*C01B 31/06* (2006.01)
*B01J 3/08* (2006.01)

(52) U.S. Cl. .................... 423/446; 423/264; 125/30.01

(58) Field of Classification Search ............... 423/446, 423/264; 125/30.01; 264/642, 666, 667, 264/31; 63/32
See application file for complete search history.

(56) References Cited

U.S. PATENT DOCUMENTS

| 2,941,241 | A | 6/1960 | Strong |
| 2,941,248 | A | 6/1960 | Hall |
| 2,947,611 | A | 8/1960 | Bundy |
| 3,030,662 | A | 4/1962 | Strong |
| 3,134,739 | A | 5/1964 | Cannon |
| 3,141,855 | A | 7/1964 | Wentorf, Jr. |
| 3,148,161 | A | 9/1964 | Wentorf, Jr. et al. |
| 3,609,818 | A | 10/1971 | Wenorf, Jr. |
| 3,767,371 | A | 10/1973 | Wentorf, Jr. et al. |
| 4,042,673 | A | 8/1977 | Strong |
| 4,082,185 | A | 4/1978 | Strong |
| 4,124,690 | A | 11/1978 | Strong et al. |
| 4,174,380 | A | 11/1979 | Strong et al. |
| 4,289,503 | A | 9/1981 | Corrigan |
| 4,301,134 | A | 11/1981 | Strong |
| 4,399,364 | A | 8/1983 | Evans et al. |
| 4,673,414 | A | 6/1987 | Lavens et al. |
| 4,954,139 | A | 9/1990 | Cerutti |

FOREIGN PATENT DOCUMENTS

| EP | A 0 014 528 | 8/1980 |
| EP | A 275 063 | 7/1988 |
| EP | A 0 324 179 | 7/1989 |
| EP | 324 179 B1 | 10/1992 |
| EP | 0 615 954 A1 | 9/1994 |
| EP | 638 670 | 2/1995 |
| EP | A 638 670 | 2/1995 |
| EP | 668 377 | 8/1995 |
| EP | A 0 668 377 | 8/1995 |
| EP | 0 671 482 A1 | 9/1995 |
| GB | A 984 194 | 2/1965 |
| GB | A 1 541 847 | 3/1979 |
| JP | 0201 | 1/1990 |
| JP | A 2 018 980 | 1/1990 |
| WO | WO 01/14050 A1 | 3/2001 |

OTHER PUBLICATIONS

Kalinin, The Impact of High Temperatures on the Colour Characteristics of Natural Diamond with a Brown Tint Chapter 4 1992 (no month).*
R.M. Chrenko, R.E. Tuft & H.M. Strong; Transformation of the state of nitrogren in diamond, vol. 270, No. 5633, Nov. 10, 1977, pp. 141-144.
A.V. Nikitin et al.; Dokl. Akad. Nauk SSSR, vol. 182, No. 3, 1968, pp. 573-575.
A.V. Nikitin et al.; Soviet Physics—The Effect of Heat and Pr ssure on Certain Physical Properties of Diamonds, Doklady, vol. 13, No. 9, Mar. 1969, pp. 842-844.
H. Kanda & K. Watanabe; 7th European Conference on Diamond, Diamond-Like and related materials jointly with ICNDST-5, the 5th International Conference on the New Diamond Science and Techology, Turs, France, Sep. 8-13, 1996. Publication in: Diam. Related materials, vol. 6, No. 5-7, Apr. 1997, pp. 708-811.

(Continued)

Primary Examiner—Stuart Hendrickson
(74) Attorney, Agent, or Firm—Pepper Hamilton LLP

(57) ABSTRACT

The present invention is directed to a method for changing the color of colored natural diamonds. The method includes placing a discolored natural diamond in a pressure-transmitting medium which is consolidated into a pill. Next, the pill is placed into a high pressure/high temperature (HP/HT) press at elevated pressure and elevated temperature for a time sufficient to improve the color of the diamond. The diamond may be exposed at elevated-pressure and elevated-temperature conditions within the graphite-stable region of the carbon-phase diagram—without significant graphitization of the diamond, or above the diamond-graphite equilibrium and within the diamond-stable region of the carbon-phase diagram. Finally, the diamond is recovered from said press. Colorless Type Ia and Type II diamonds may be made by this method.

33 Claims, 2 Drawing Sheets

OTHER PUBLICATIONS

Trevor Evans, "Aggregation of Nitrogen in Diamond", published in The Properties of Natural and Synthetic Diamond, Editor J.E. Field, pp. 259-290, Academic Press, London (1992), ISBN#012-255352-7.

G. Davies and I. Summersgill, Diamond Research, pp. 6-15, Industrial Diamond Information Bureau, London (1973) "Nitrogen Dependent Optical Properties of Diamond.".

Partial dissociation of nigrogen aggregrates in diamond by high temperature-high pressure treatments, M.R. Brozel, T. Evans and R.F. Stephenson, Proc. R. So. Lond. A, 361, 109-127 (1978).

Diamonds and Diamond Grading, G. Lenzen; London Boston Durban Singapor Syndey Toronto Wellinton, pp. 205-212.

The Nature of Color in Diamonds, Emmanuel Fritsch; Cambridge Univ. Press, Oct. 1997.

One-phonon infrared absorption in diamond, J. Phys. C: Solid State Phys., 17 (1984) 1127-1140, Printed in Great Britain; CD Clark and ST Davey.

W.E. Jackson et al., "Synthetic Diamond Strength Enhancement Through High Pressure/High Temperature Annealing", Mat. Res. Soc. Symp. Proc., vol. 383, pp. 267-272, (1995).

S.C. Lawson et al., "Nickel in Diamond: an annealing study", Diamond and Related Materials, vol. 2, pp. 130-135, (1993).

Simon C. Lawson et al., "An annealing study of nickel point defects in high pressure synthetic diamond", J. Appl. Phys., vol. 73, No. 8, pp. 3967-3973, (1993).

Yu. L. Orlov, "The Mineralogy of the Diamond", John Wiley & Sons, Inc., pp. 14-145, (1977)

Trevor Evans et al., "The stages of nitrogen aggregation in diamond", J. Phys. C: Solid State Phys., vol. 14, pp. L379-L384, (1981).

Dr. K. Schmetzer, "Behandlung natürlicher Diamenten zur Reduzierung der Gelb- oder Braunsattigung", Goldschmiede Zeitung, vol. 97, No. 5, (1999).

Aggregation and dissolution of small and extended defect structure in Type la diamond; L.A. Bursill and R.W. Glaisher; American Mineralogist; vol. 70, pp. 608-618, 1985.

Optical absorption and luminescence in diamond; John Walker; Rep. Prog. Physc., vol. 42, 1979, Printed in Great Britain; pp. 1606-1659 (abstract).

The kinetics of the aggregation of nitrogen atoms in diamond; T. Evans and Zengdu; Proc. R. Soc. Lond. A381, pp. 159-178 (1982).

Changes in the defect structure of diamond due to high temperature+high pressure treatment; T. Evans and P. Rainey; Proc. R. Soc. Lond. A344, 111-130 (1975); printed in Great Britain.

L.D. Belimenko et al; Soviet Physics—Doklady, vol. 26, No. 8, Aug. 1981, pp. 722-724, R.J. Caveney;Phil. Mag., vol. 18, No. 151, 1968, pp. 193-195 (abstract).

V.A. Borisenko et al; Sint. Almazy-Klyuch Tekh. Prog., [Dokl. Sov. Zarub. Uch. Spets., Nauchno-Tekh. Konf. Evr. Stran., Chlenov SEV SFRYu] (1977), Meeting Date 1974, vol. 1, pp. 53-39 (abstract).

T. Evans & R. Rainey; Proc. R. Soc. London, Ser. A., vol. 344, No. 1636, 1975, pp. 111-130 (abstract).

A. T. Collins, "Colour Centres in Diamond," J. Gemm. 1982, XVIII, 1, pp. 37-75.

Michael O'Donoghue, "A guide to man-made gemstones," Van Nostrand Reinhold Company, pp. 93-101.

"Treated color yellow diamonds with Green Graining," Gems & Gemology, Summer 1997.

Steven Webb and W. E. Jackson, "Synthetic diamond crystal strength enhancement through annealing at 50 kbar and 1500C"—J Mater Res., vol. 10, No. 7, Jul. 1995.

* cited by examiner

HIGH PRESSURE/HIGH TEMPERATURE PRODUCTION OF COLORLESS AND FANCY-COLORED DIAMONDS

RELATED APPLICATIONS

This application is a continuation of U.S. patent application Ser. No. 10/338,136, filed Jan. 8, 2003, now U.S. Pat. No. 6,692,714, which is a continuation-in-part under 35 U.S.C. § 120 of U.S. Application Ser. No. 09/162,206, filed Sep. 28, 1998, abandoned, and U.S. Application Ser. No. 08/966,642, filed Nov. 10, 1997, abandoned, which is a continuation-in-part of U.S. Application Ser. No. 08/953,701, filed Oct. 17, 1997, abandoned, all of which are herein incorporated by reference in their entirety.

BACKGROUND OF THE INVENTION

The present invention generally relates to the production of gem-quality diamonds and more particularly to the production of these gem-quality diamonds from inferior-grade discolored or so-called "brown" diamonds.

Diamonds are conventionally divided into four main categories which are designated as Type Ia, Type Ib, Type IIa, and Type IIb. In reality, there is a smooth change in impurity concentration/arrangement between the four types so that intermediate varieties thereof also exist. Type I diamonds contain nitrogen as the major impurity. This category is divided into Type Ia diamonds where the nitrogen exists in an agglomerated state as either pairs called A Centers (Type IaA) or clusters of four nitrogen atoms called B centers (Type IaB) or mixtures thereof (Type IaA/B), and Type Ib where the nitrogen occurs as only isolated single nitrogen atoms called C Centers. Some diamonds also contain clusters of three nitrogen atoms called N3 Centers. Over 98% of the larger clear natural diamonds are Type Ia. Type Ib diamonds are rarer and amount to only 0.8% of natural stones. Type Ia diamonds also contain platelets, which are small flat inclusions a few atoms thick and about 300 atoms across, that may contain some nitrogen in an unspecified form. Type Ia diamonds also may contain voidites which are small equiaxed cavities that are either vacant or which contain nitrogen in an unknown form. Voidites tend to be seen principally in Type IaA/B or Type IaB diamonds.

Generally, it is believed that all nitrogen-containing diamonds started out as Type Ib with isolated nitrogen atoms (C Centers) that were incorporated during crystal growth. During a long period of time (perhaps up to 1 billion years), the diamonds were annealed within earth's mantel at temperatures between 1000° and 1300° C. and at high pressure. During this time, the nitrogen atoms migrated in the diamonds and principally formed two types of aggregates, namely pairs (A Centers) or clusters of four (B Centers).

$$4C \rightarrow 2A \rightarrow 1B \tag{1}$$

It is believed that the clusters of four nitrogen atoms (B Centers) are formed when migrating nitrogen pairs (A Centers) collide with each other. Thus, the progression is believed to be Type Ib to Type IaA to Type IaA/B to Type IaB. A small amount of nitrogen may also agglomerate as N3 centers which are a planar array of three nitrogen atoms surrounding a common vacancy. It is believed that such centers are formed when an isolated nitrogen (C Center) combines with a nitrogen pair (A Center) during the agglomeration process. N3 centers apparently are less stable than A and B centers as their concentration in Type Ia diamonds is relatively small. Platelets form as soon as the annealing has progressed to the Type IaA stage. Voidite formation, as well as some platelet disintegration, occurs as B clusters form and becomes pronounced in the Type IaB stage of annealing.

Type II diamonds make up approximately 0.7% of all diamonds and contain no nitrogen. Type II diamonds are further divided into Type IIa and Type IIb. Type IIa diamonds have no impurities. Type IIb diamonds contain boron in the parts per million range and are extremely rare, comprising less than 0.001% of all diamonds.

The color of natural diamonds can range from clear and colorless to yellow, orange, red, blue, brown, and even green. For natural diamonds, a brownish tinge is the most common color and may occur in as many as 98% of mined natural diamonds. Type Ia diamonds containing nitrogen can be colorless if all of the nitrogen is tied up in A or B centers. However, if isolated nitrogen atoms (C Centers) or N3 centers are present, the diamonds will have a yellow tinge whose hue depends on the concentration of these forms of nitrogen atoms. Typically, the N3 centers produce the washed-out yellow that is referred to as "Cape Yellow," while isolated nitrogen atoms (C Centers) produce the richer more vibrant "Canary Yellow" if their concentration is high enough. A small amount of yellow in an otherwise colorless diamond can significantly decrease its market price. However, a rich deep yellow color can produce a "fancy" yellow that has a very high value in the marketplace.

Changing the concentration of N3 centers not only will change the yellow color of a diamond, but can increase the actual brilliance or amount of light thrown back by the diamond. The electrons around an N3 center absorb light in the invisible ultraviolet part of the natural light spectrum, as well as blue light in the visible spectrum. In normal daylight, about $\frac{1}{10}$ of the energy of the light is in the form of invisible ultraviolet radiation. If the N3 concentration is relatively high, i.e., 100 ppm, then visible blue light is strongly absorbed and the diamond will have a definite yellow color, which will lower its value. However, if the concentration of N3 centers is reduced by some treatment so that the yellow coloring disappears, the remaining N3 centers can affect the brilliance of a diamond by a two-stage process. First, an invisible ultraviolet photon is absorbed by an N3 center. The energy is temporarily stored in the N3 center. Some of this energy leaks away in the form of phonons or lattice vibrations. After a storage time pre-determined by the half-life of the center, the N3 center will re-emit the remaining energy as visible light. Since some energy has been lost, the re-emitted light is no longer in the high-energy invisible ultraviolet part of the spectrum. Instead, the re-emitted light now is in the visible spectrum (the technical term for this is "ultraviolet downshifting"). Because we do not see ultraviolet light, we do not notice that it is being absorbed (an animal, like a bee that can see ultraviolet light, would see the brilliance of the diamond decreased by the absorption of ultraviolet light by N3 centers). All we see is the increased emission in the visible spectrum and, thus, the diamond now appears extraordinarily bright. Consequently, a controlled reduction of N3 centers in a Type Ia diamond by any treatment will increase the value of a diamond containing them in two ways. First, elimination of some N3 centers reduces or eliminates the yellow tinge in the diamond. Second, the remaining N3 centers will increase the brilliance of the diamond relative to a perfect Type IIa diamond.

Most Type Ia diamonds as mined are of a brownish color. A brown color can result from the mixture of many other fundamental colors. One way is to mix some yellow coloring from isolated nitrogen atoms (C Centers) or N3 centers with some black color, perhaps from submicroscopic inclusions of graphite. The mixture of yellow and black will produce a brown color. Another way to make a brown diamond is to mix a color center that produces a green diamond with a color center that produces a red diamond. The combination of red and green again will produce a brown color. In fact, there are an infinite number of color combinations that will produce a brown color. Thus, it is not possible to determine the color centers causing the color of a diamond by its color. However, the reverse process is unique; that is, if one knows the type and concentration of color centers in a diamond, one can predict the resulting color.

Type II diamonds vary from colorless to a deep blue color. Type II diamonds are most valuable when they are colorless or a pure-blue color. Excessive mechanical deformation and plastic flow are believed to cause many Type II diamonds to have a reddish brown or pink tinge which lowers their value considerably. Many natural Type IIa diamonds have this color tinge and their value could be greatly enhanced as jewelry if they could be made colorless. Some Type IIa diamonds have a steel gray haze in them that also greatly decreases their value. Generally, in the diamond trade, a discolored diamond whether it is brownish, reddish brown or steel gray is labeled as a "brown" diamond. Previous attempts to treat Type IIa diamonds to increase their value have failed. G. Lenzen, *Diamonds and Diamond Grading*, p. 207, Buttersworth, London (1983). Both neutron and electron irradiation followed by annealing caused Type IIa diamonds to turn brown, thereby greatly lowering the value of the diamonds.

Type IIb diamonds have a blue color that is imparted by the boron impurity acting as an electron acceptor. Because of the rarity of Type IIb diamonds and their attractive blue color, they have the highest value per carat as jewelry items.

In general, the pricing of diamonds is a sensitive function of their color. Fancy-color diamonds, such as the canary yellows, blue, red, pink and green diamonds, are rare and have the highest prices of any diamonds. Because of their rarity, the market for them is not well organized and they are usually sold via a Sotheby's or Christie's type of auction. Brown diamonds are an exception to the fancy color diamond market. Brown diamonds are very common and in the past have been culled and used as industrial diamonds and are correspondingly inexpensive. After fancy color diamonds, colorless diamonds command the highest prices. The degree of colorlessness has a strong nonlinear effect on the price of the diamond. Even the faintest tinge of yellow can considerably reduce the price of colorless diamonds.

In view of the relative prices of fancy colors, colorless, and brown diamonds, there is a strong financial incentive to change brown diamonds to either colorless diamonds or to fancy color diamonds. Irradiation has been used frequently to change the color of such diamonds from unattractive off-colors to attractive blue, green, orange, black, and yellow colors. Electrons, neutrons, gamma rays, and alpha particles have been used to produce irradiation-produced color centers in diamond. Neutron, gamma, and electron irradiation are preferred because they produce a more uniform coloration of the diamond because of their good penetrating power. There is some danger in using neutrons since radioactive species can be produced in inclusions in diamonds by neutron activation. In addition, the most common electron or alpha-irradiation treatments only develop a superficial color confined to the outer portions of the diamond.

Essentially, all of the different types of radiation produce vacancies in diamond which are seen as the GR1 band in the visible spectrum. Absorption by the GR1 band produces a green, blue-green, dark green, or even a black color in the diamond by absorption at 740.9 nm and from 412–430 nm. Vacancy-color centers can be modified by high-temperature annealing to produce colors ranging from blue to pink to red to green. Annealing can be done at temperatures as low as 600° C., because the large number of vacancies introduced by irradiation temporarily increases the mobility of nitrogen and other impurities in the diamond. Eventually, the vacancies diffuse to and are absorbed by vacancy sinks, such as free surfaces, dislocations, and inclusion interfaces in the diamond. Naturally, as the vacancies disappear, their direct effect on the color of the diamond also lessens. Thus, the color gradually goes through a sequence of one from blue to green to brown to yellow and back to the original color of the diamond. The annealing can be stopped at any point of the annealing sequence to produce the color desired. Multiple irradiation steps and annealing steps can be done to further manipulate the color.

In recent years, people have annealed diamonds at progressively higher temperatures to try to eliminate telltale signs of irradiation in the diamond because "treated" diamonds are valued at a discount to natural diamonds. The GR1 line from the vacancy begins to disappear above 400° C. as the vacancies anneal out of the crystal. Other irradiation lines, however, persist to higher temperatures. Much of the information concerning diamond irradiation and annealing treatments is kept as trade secrets by the organizations carrying out such treatments.

An example of a possibly irradiated and heat-treated greenish-yellow diamond was reported in a recent issue of *Gems & Gemology*, XXXIII, pp. 136–137, (Summer, 1997). Several one-carat round brilliant stones were given to the GIA laboratory for testing. From their spectroscopic studies, GIA concluded that these diamonds had been treated. In addition, they inferred that the diamonds had been irradiated and subsequently heated to above 1450° C. Although the normal irradiation signatures, such as the GR1 line at 741 nm and the HIb and HIc lines arising from a combination of irradiation and heat treatment, were absent in these two stones, the stones did have an absorption peak in the near-infrared range at 985 nm. Although the detection of treated stones is more of an art than a science, it is commonly believed that diamonds that show no absorption peaks at 595 nm, 1936 nm, and 2024 nm have "almost certainly not been treated." J. Wilks, et al., *Properties and Applications of Diamonds*, p. 91, Buttersworth, London (1991).

Type Ia diamonds in which N3 centers give a slight yellow tinge to the crystal have been the most commonly selected stones for irradiation and annealing treatments. Electron or neutron irradiation of these stones and a subsequent heat treatment generates H3 (Nitrogen-Vacancy-Nitrogen) and H4 (Nitrogen-Nitrogen-Vacancy-Nitrogen-Nitrogen) centers which give a pleasing amber-gold color to the stones when exposed to light of the visible spectrum. It has been found that diamonds that do not luminesce produce more attractive colors than diamonds that luminesce. A. T. Collins, J. *Gemology*, XVIII, pp. 37–75 (1982). Apparently, existing color centers in the stone add to the color produced by the irradiation and heat treatment, and the resulting color is less desirable.

Changing the concentration of N3 centers not only will change the yellow color of a diamond, but can increase the actual brilliance or amount of light thrown back by the diamond. The electrons around an N3 center absorb light in the ultraviolet part of the natural light spectrum as well as blue light in the visible spectrum. In normal daylight, about ⅕ of the energy of the light is in the form of ultraviolet radiation. If the N3 concentration is relatively high, i.e., 100 ppm, then visible blue light is strongly absorbed and the diamond will have a definite yellow color, which will lower its value. However, if the concentration of N3 centers is reduced by some treatment so that the yellow coloring disappears, the remaining N3 centers can affect the brilliance of a diamond by a two-stage process. First, an ultraviolet photon is absorbed by an N3 center. The energy is temporarily stored in the N3 center. Some of this energy leaks away in the form of phonons or lattice vibrations. After a storage time pre-determined by the half-life of the center, the N3 center will re-emit the remaining energy as light. Since some energy has been lost, the re-emitted light is no longer in the high-energy ultraviolet part of the spectrum. Instead, the re-emitted light now is in the visible spectrum (the technical term for this is "ultraviolet downshifting"). Because we do not see ultraviolet light, we do not notice that it is being absorbed (an animal, like a bee, that can see ultraviolet light would see the brilliance of the diamond decreased by the absorption of ultraviolet light by N3 centers). All we see is the increased emission in the visible spectrum and, thus, the diamond now appears extraordinarily bright. Consequently, a controlled reduction of N3 centers in a Type Ia diamond by any treatment will increase the value of a diamond containing them in two ways. First, elimination of some N3 centers reduces or eliminates the yellow tinge in the diamond. Second, the remaining N3 centers will increase the brilliance of the diamond relative to a perfect Type IIa diamond.

Another approach that has been tried to alter the color of a natural type Ia diamond is to go to very high temperatures and pressures where nitrogen atoms are more mobile. For each 100° Centigrade increase in temperature, the mobility of nitrogen in diamond increases almost an order of magnitude. See Evans, et al., *Proc Roy Soc Lond*, a 344, 111–130 (1975) and Bonzel, et al., *Proc Roy Soc Lond*, A 361, 109–127 (1978), discussing annealed Type Ia diamonds containing nitrogen at temperatures above 1960° C. under stabilizing pressures as high as 85 kilobars (kbars). The application of pressure is necessary to keep the diamond in the diamond-stable part of the Pressure-Temperature diagram of carbon (carbon-phase diagram). F. P. Bundy, *Physica*, A156, 169–178 (1989). Otherwise, it is reported that exposure of diamond to such high temperatures would result in the rapid graphitization of the diamond. The diamond-stable phase versus the graphite-stable phase is generally accepted as being defined by the Simon-Berman line. The Simon-Berman line separates the diamond and graphite-stable regions on the phase/temperature (PT) plot. This line may also be referred to as the diamond-graphite equilibrium line. C. S. Kennedy and G. C. Kennedy in J. Geophysics Res, Vol. 81, pp. 2467–2469 (1976) define the Simon-Berman line by the equation:

$P\text{(kilobars)}=19.4+0.025\ T$ (degrees Centigrade).

Most of the diamonds that have been treated by Evans et al. and Bonzel et al. were of the type IaA/B, i.e., they had a mixture of nitrogen clusters comprised of either nitrogen pairs (A Centers) or quadruples (B Centers) since diamonds with either pure IaA or IaB characteristics are very rare. All of the diamonds contained platelets. In the diamonds with predominantly A-Center clusters, the diamonds turned a yellow color as some of the clusters broke up and formed C Centers, isolating nitrogen atoms (Type Ib). They were less successful in treating diamonds with predominantly B Centers which apparently are more stable than A Centers. The most attractive and deepest yellow colors were obtained with Type Ia diamonds at temperatures between 2250° and 2300° C. and 48 kilobars of pressure (Evans et al., supra.).

Although Evans and co-workers achieved a successful color change, both the Type Ia and IIa diamonds crumbled into small pieces. In other words, the operation was successful but the patient died. Nothing of economic value was created and any original value of the diamonds was destroyed by the treatment. As a result of their work, high-pressure and high-temperature treatments of diamond to change their color were abandoned by the diamond research community in favor of irradiation and low-temperature annealing.

BRIEF SUMMARY OF THE INVENTION

The present invention is directed to a method for changing the color of colored natural diamonds. The method includes placing a discolored natural diamond in a pressure-transmitting medium; i.e., a powder which is consolidated into a pill. Next, the pill is placed into a high pressure/high temperature (HP/HT) press at elevated pressure and elevated temperature for a time sufficient to improve the color of the diamond. The diamond may be exposed at elevated-pressure and elevated-temperature conditions, such as in the graphite-stable region of the carbon-phase diagram—without significant graphitization of the diamond, or above the diamond-graphite equilibrium and within the diamond-stable region of the carbon-phase diagram. The graphite-stable and diamond-stable ranges are divided by an equilibrium line typically known as the Simon-Berman line. Finally, the diamond is recovered from the press. Discolored Type IIa and certain types of discolored Type Ia diamonds, i.e. mainly Type IaB's, can be made colorless by this method.

When operating at high-temperature and high-pressure conditions, pressures range from about 10 to about 200 kilobars, preferably from about 50 to about 90 kilobars, and temperatures range from about 1500° C. to about 3500° C., preferably from about 1800° C. to about 2700° C. Pressing times in the HP/HT press can range from as short as about 30 seconds up to as long as 96 hours or more, with pressing times preferably ranging from around 5 minutes up to 24 hours. These conditions (time, temperature, and pressure) are correlated and adjusted to the nature of the discoloring defects in the diamond which have to be altered in order to improve the color of the diamond.

Advantages of the present invention include the ability to upgrade the color of discolored or off-colored diamond to produce fancy-color diamonds or colorless diamonds. Another advantage is the ability to maintain the mechanical and structural integrity of the color-improved diamonds. A further advantage is the specific ability to make colorless diamonds from discolored Type IIa diamonds. A further advantage is the specific ability to make blue diamonds from discolored Type IIb diamonds. A further advantage is the specific ability to make colorless diamonds from discolored Type IaB diamonds. A further advantage is the ability to retain the optical clarity of the treated diamonds disclosed herein. These and other advantages will be readily apparent from the disclosure set forth herein.

BRIEF DESCRIPTION OF THE DRAWINGS

For a fuller understanding of the nature and objects of the present invention, reference should be had to the following detailed description taken in connection with the accompanying drawings, wherein.

DETAILED DESCRIPTION OF THE INVENTION

The present invention is illustrated in connection with a conventional HP/HT apparatus which may be of the belt- or die-type described, for example, in U.S. Pat. Nos. 2,947,611; 2,941,241; 2,941,248; 3,609,818; 3,767,371; 4,289,503; 4,673,414; and 4,954,139. However, it will be appreciated that the method of the present invention will find applicability in any HP/HT apparatus which is capable of providing the required HP and HT conditions simultaneously. Accordingly, it is intended that such other HP/HT apparatuses are within the scope of the invention herein described.

Figure 1:
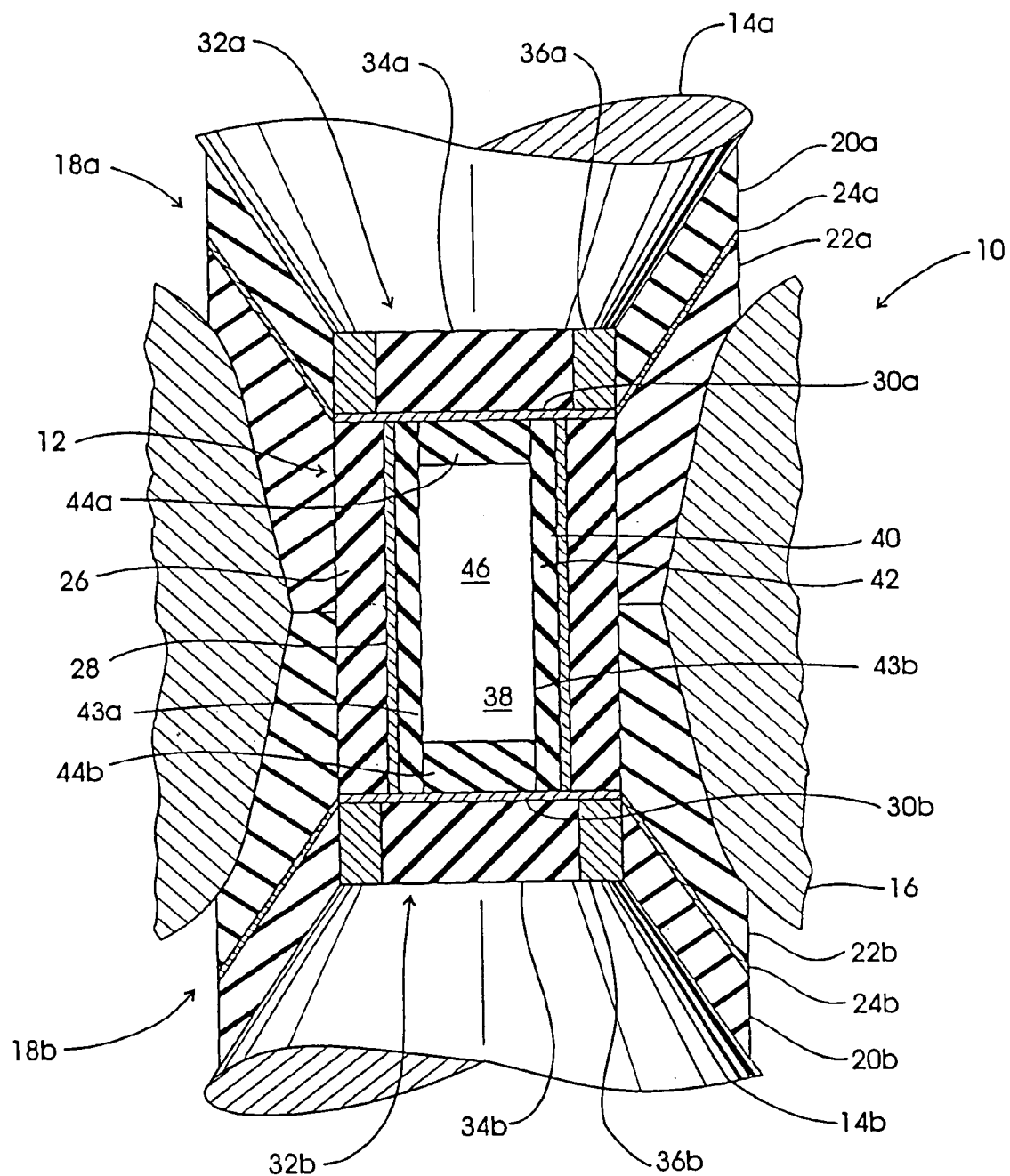
FIG. 1 is a cross-sectional view of a conventional HP/HT apparatus which may utilized to anneal discolored diamond for improving their color.

Looking then to FIG. 1, an illustrative HP/HT apparatus useful in the practice of the present invention is shown generally at 10 to comprise a generally cylindrical reaction cell assembly 12 interposed between a pair of punches, 14a and 14b, and surrounded by a generally annular belt or die member 16. Preferably, both punches 14 and belt member 16 are formed of a relatively hard material, such as cemented tungsten carbide. Between punches 14 and belt member 16 are a pair of insulating assemblies, 18a and 18 b, each of which is formed of a pair of thermally- and electrically-insulating members, 20a–b and 22a–b, each preferably formed of pyrophyllite or the like, and having an intermediate metallic gasket, 24a and 24b, disposed therebetween.

As shown, reaction cell assembly 12 includes a hollow cylinder 26, which may be formed of a material, such as salt or the like, which is converted during HP/HT by phase transformation or compaction to a stronger, stiffer state or, alternatively, of a talc material or the like which is not so converted. In either case, the material of cylinder 12 is selected as being substantially free of volume discontinuities or the like, under HP/HT as may occur, for example, with pyrophyllite or alumina materials. Materials meeting such criteria are described in U.S. Pat. No. 3,030,662.

Positioned concentrically within salt cylinder 26 is an adjacent cylinder 28, which is provided as a graphite electrical resistance heater tube. Electrical connection with heater tube 28 is achieved via an adjacent pair of conductive-metal end discs, 30a and 30b, which are axially-disposed with respect to heater tube 28. Adjacent each disc 30 is provided an end cap assembly, shown generally at 32a and 32b, each of which comprises an insulating plug, 34a and 34b, surrounded by an electrically conductive ring, 36a and 36b.

It will be appreciated that the interior of heater 28, along with end discs 30, salt cylinder 26, and end cap assemblies 32, defines a generally-cylindrical inner chamber, shown at 38, having defined axial and radial extents and containing a pressure-transmitting medium 40. Pressure-transmitting medium 40 is selected as having a relatively low coefficient of internal friction to make it semi-fluid at HP/HT conditions, and may be provided as a cylindrical salt liner 42, which defines radial pressure-transmitting medium layers 43a and 43b, and is fitted with an axial pair of salt plugs, 44a and 44b, each of which defines an axial pressure-transmitting medium layer. Preferably, salt liner 42 and plugs 44 are formed of a graphite material or of sodium chloride, but also may can be formed of any chloride, iodide, or bromide of sodium, potassium, or calcium or a mixture thereof. Alternatively, pressure-transmitting medium 40 may be provided in powdered or particulate form. In either case, medium 40 defines a cavity space, as is shown at 46, which is configured to receive the discolored diamond to be annealed. Such is the configuration of a representative HP/HT apparatus for practicing the present invention.

In departing from conventional uses of HP/HT apparatuses, the diamond to be annealed is placed within a pressure-transmitting medium, preferably a finely divided powder, which then is consolidated or densified to in excess of 90% of its theoretical density to form a pill. The pill medium must transmit hydrostatic pressure without loss as a continuum onto diamond surfaces in the HP/HT apparatus to avoid shear stresses that could plastically deform the diamond being treated. The pill medium also must be thermally and chemically stable, and preferably should not react with or cause dissolution of diamond. Suitable media are stable fluids or gases at annealing conditions or highly plastic solids, including, but not limited to, salts such as describe above, oxides such as magnesium oxide or calcium oxide, carbides, nitrides, borides, such as boron nitride or boron carbide, and carbons such as graphite. To consolidate the pressure-transmitting medium, the medium may be melted and solidified to form the pill. For example, a salt may be used as the pressure-transmitting medium, contacted with the diamond as a melt or a powder to be melted, and solidified to form a pill. The melting temperature of the molten salt should still be low enough to avoid graphitization of the diamond during the casting, and the resulting solid should mechanically plastically yield at the processing temperatures to avoid stress concentrations. The pill medium also must be scaleable to the high pressures and high temperatures that are encountered with the HP/HT apparatus. Finally, the pill medium must possess a volume compressibility which is small and comparable to the gasketing system, i.e., it must be void-free and close to its theoretical lattice density at annealing conditions. Multiple pills can be housed within cavity 46 if necessary, desirable, or convenient.

When operating at high-temperature and high-pressure conditions, pressures range from about 10 to about 200 kilobars, preferably from about 50 to about 90 kilobars, and temperatures range from about 1500° C. to about 3500° C., preferably from about 1800° C. to about 2700° C. The high-pressure and high-pressure conditions may further be defined in accordance with where the specific pressure and temperature points lie on the carbon-phase diagram. Thus, high-pressure and high-temperature conditions may be defined by their specific pressure and temperature ranges or by the designations of graphite-stable range and diamond-stable range. When operating in the graphite-stable range of the carbon-phase diagram, pressure conditions typically range from about 10 to about 89 kilobars, preferably ranging from about 20 to about 80 kilobars and most preferably ranging from about 50 to about 70 kilobars, and temperatures conditions typically range from about 1500° C. to about 3500° C., preferably ranging from about 2200° C. to about 2700° C. When operating in the diamond-stable range of the carbon-phase diagram, pressure conditions typically range from about 50 to about 200 kilobars (5 to 20 GPa), preferably ranging from about 70 to about 90 kilobars, and temperatures conditions typically range from about 1500° C. to about 3500° C., preferably ranging from about 1800° C. to about 2500° C. Working conditions within these ranges depend upon the nature of the defect in the diamond which have to be removed or changed to improve color and can readily be determined by those skilled in the art without undue experimentation.

The disclosure of this invention discusses operating in the graphite-stable region of the carbon-phase diagram as well as operating above the diamond-graphite equilibrium line and within the diamond-stable region of the carbon-phase diagram. One skilled in the art will understand that these two regions encompass the entire solid carbon-phase diagram.

The equilibrium, discussed above as the Simon-Berman line, represents the equilibrium between the graphite-stable region and the diamond-stable region. Since graphite can exist in equilibrium with diamond on the Simon-Berman line, both the graphite-stable region and the diamond-stable region are inclusive of the equilibrium. In view of this overlap, Applicants have defined the graphite-stable range as the region comprising the entire graphite-stable range, including the equilibrium, and the diamond-stable range as comprising the region above the equilibrium and within the diamond-stable range. The diamond-stable range, as defined in this invention, comprises the entire diamond-stable region, except for that falling on the equilibrium.

After the diamond and pressure-transmitting medium are consolidated into a pill, the pill is exposed to elevated-pressure and elevated-temperature conditions for a time sufficient to change the color of the diamond. A diamond may be exposed to high-temperature and high-pressure conditions in either the graphite-stable range or the diamond-stable range for a certain period of time. Generally, a diamond will be able to endure exposure in the diamond-stable range for significantly longer periods of time than exposure in the graphite-stable range. Indeed, operating in the graphite-stable range is time sensitive, and the period of time a diamond is exposed in the graphite-stable range should be closely monitored. The time period must be long enough so that the color of the diamond improves but not so long as to destroy the diamond through graphitization. Destruction of the diamond, for these purposes, means affecting the appearance of the diamond so as to substantially limit its commercial value. Diamonds destroyed through graphitization often appear severely etched or cracked and contain internal darkening, or may be transformed entirely to graphite. As known to those of skill in the art, when annealing a diamond at high pressure and high-temperature conditions, a certain amount of the diamond will often undergo graphitization, which commonly occurs along the faces and edges of the diamond. However, such minimal graphitization is considered an expected side-effect of using a high-temperature and high-pressure process, and does not detrimentally affect the ability to recover a diamond. Significant graphitization, on the other hand, occurs when anywhere from a substantial portion to the entire diamond becomes graphitized as a result of sustained high-pressure and high-temperature conditions. For instance, when the diamond is processed for too long a period of time in the graphite-stable region, significant graphitization often occurs, resulting in the destruction of at least a substantial portion of the diamond. A process that changes the color of a diamond while significantly graphitizing the diamond might not be economically viable. When operating in the graphite-stable region, one must pay close attention to the increase in value per unit mass achieved from a color change of the diamond versus the decrease in value caused by a loss of diamond mass through graphitization.

HP/HT conditions are maintained for a time adequate for the color of the discolored diamond to improve. Such times can range from several minutes to several hours, preferably, from about 5 minutes to 24 hours, and more preferably, from about 5 minutes to about 1 hour. In this regard, the discolored diamond can be subject to multiple annealing steps at the same or at different conditions, as the examples will demonstrate. Often times, the observable color of a diamond is unsatisfactory after it has been recovered. When this is the case, the diamond is subjected the above-described procedure one or more times until the desired color has been achieved.

Discolored diamonds subjected to the inventive process may be cut and polished prior to annealing or following their recovery from the pill. Thereafter, the diamond is ready for use in jewelry or fabrication into devices, such as, for example, heat sinks, optical windows, or the like. Of special importance is the ability of the present invention to convert discolored Type IaB and even some Type IaA/B diamonds into colorless stones.

The following examples show how the present invention has been practiced, but should not be construed as limiting. In this application, all units are in the metric system, unless otherwise stated. All patents and publications referred to herein are expressly incorporated herein by reference.

EXAMPLES

In the examples, annealing of natural diamonds was done under high-temperature and high-pressure conditions using a belt type apparatus which is capable of reaching very high pressures (~90 kbars or higher) and temperatures (~2600° C. or higher). Diamond annealing in accordance with the present invention is illustrated in the examples using the following cell arrangements and operating conditions.

Figure 2:
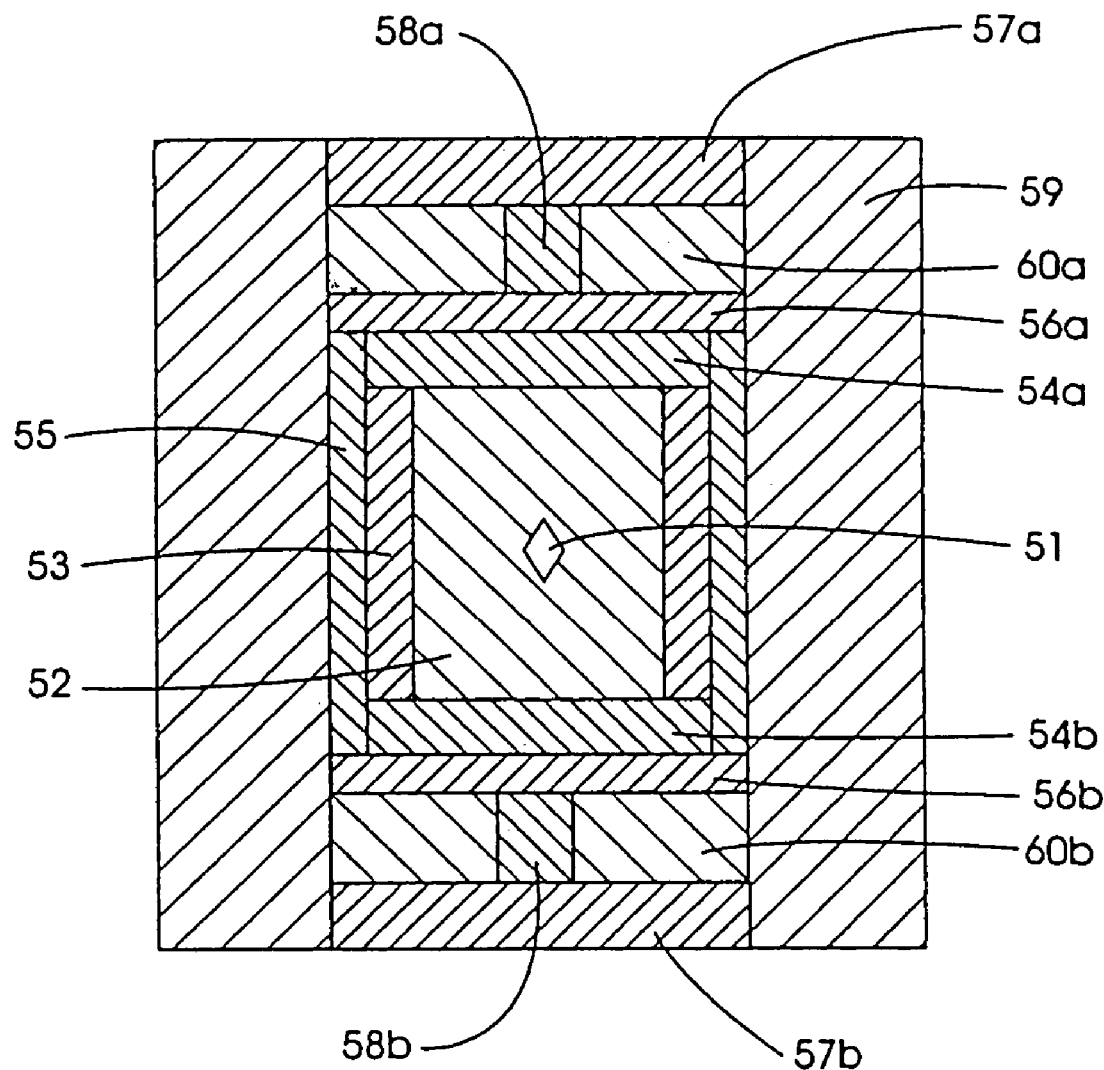
FIG. 2 is a cross-sectional view of a typical reaction cell for annealing natural diamond in the apparatus in FIG. 1.

The reaction cell assembly is schematically shown in FIG. 2. Diamond crystal 51 is placed inside cylindrical pill 52 which is made of high purity graphite, sodium chloride powder, or sodium chloride and potassium nitrate. Graphite is preferred because it does not melt during high-temperature annealing nor does graphite chemically react with or etch the diamond. For the Examples I–VI, a pill 52 with the following dimensions was used: diameter of 0.76 inches (19.3 mm) and height of 0.86 inches (21.8 mm). For Examples VII–XXIII, a pill 52 with the following dimensions was used: diameter of 0.450 inches (11.43 mm) and height of 0.500 inches (12.7 mm). Pill 52 is made by compacting the graphite powder (or other powder) and diamond crystal 51 in a hydraulic press. Pill 52 is placed within magnesium oxide tube 53 which is fitted with end discs 54a and 54b. This assembly, then, is placed within graphite tube 55 which is fitted with end discs 56a and 56b. Such assembly is placed within salt cylinder 59 whose ends are fitted with graphite pins 58a and 58b surrounded by, respectively, salt cylinders 60a and 60b. Graphite discs 57a and 57b, respectively, seal the ends of salt cylinder 59. Rings 61a and 61b are optional, and, if implemented, are made of ceramic materials which improve the stability of the reaction cell during HP/HT run. Examples I–VI were run with rings 61a and 61b, and-Examples VII–XXIII were run without rings 61a and 61b.

The reaction cell assembly then is placed inside a high pressure apparatus (such as a belt-type apparatus) using standard gasket assemblies to form a seal at high pressure and to make electrical contact with the punches so that it can be heated with electrical power.

When operating in the graphite-stable range, a typical annealing run starts with the reaction cell being pressurized to a set pressure of ~60 kbars. The electrical power is turned on when the pressure reaches ~96% of the set pressure.

Initially, the diamond is heated to approximately 1200° C. and held at this temperature for one minute. Thereafter, the temperature is increased to the set value, e.g., approximately 2500° C., in 2.5 minutes and held at the set value for 18 minutes. The temperature should remain steady at the set temperature during the last 6 minutes. Then the power is slowly reduced to nil in 1.5 minutes. The cell pressure is held constant for about 4 minutes and the pressure then slowly released. The reaction cell is removed from the HP/HT apparatus and the graphite pill containing the diamond is removed. The diamond is recovered by digesting the pill in a boiling mixture of 90% sulfuric acid and 10% nitric acid.

When operating in the diamond-stable range, a typical annealing run starts with the reaction cell being pressurized to a set pressure of ~80 kbars. The electrical power is turned on when the pressure reaches ~96% of the set pressure. Initially, the diamond is heated to approximately 1200° C. and held at this temperature for one minute. Thereafter, the temperature is increased to the set value, e.g., approximately 2300° C., in 2 minutes and held at the set value for 18 minutes. The temperature is slowly reduced to 500° C. in 5 minutes and the power is turned of and the pressure then slowly released. The reaction cell is removed from the HP/HT apparatus and the graphite pill containing the diamond is removed. The diamond is recovered by digesting the pill in a boiling mixture of 90% sulfuric acid and 10% nitric acid.

In Examples I–VI, diamonds are treated in the graphite-stable range of the carbon-phase diagram. In Examples VII–XXVI, diamonds are treated in the diamond-stable range. The table following the examples summarizes all the examples.

Example I

A Type IIa natural rough diamond weighing 3.49 carats and being brown in color was embedded inside a graphite pill made by pressing high-purity graphite powder. The diamond was annealed at ~60 kbars and 2450° C. for 6 minutes. The diamond crystal was recovered and visual examination showed that its color had changed to clear or colorless.

Example II

A Type IIa natural polished diamond weighting 3.29 carats and brown in color was placed inside a pill made by pressing high-purity sodium chloride powder. The diamond was annealed at ~60 kbars and ~2500° C. for 6 minutes. Visual examination of the recovered diamond showed that the color had changed to clear or colorless.

Example III

A Type Ia natural rough diamond weighing 2.46 carats and brown in color was placed inside a pill made by pressing high purity graphite powder. The diamond was annealed at ~60 kbars and ~2550° C. for ~8 minutes. Visual examination of the recovered diamond showed that color had changed to intense yellow. The spectrum of this stone in the UV, visible, near infrared, and infrared showed no unusual absorption lines that are not seen in natural untreated diamonds. Specifically, the normal irradiation signatures, such as the GR1 line at 741 nm and the H1b and H1c lines arising from a combination of irradiation and heat treatment were absent.

Example IV

A Type Ia natural rough diamond weighing 1.79 carats and brown in color was placed inside a pill made by pressing high-purity graphite powder. The diamond was annealed at ~60 kbars and 2550° C. for ~8 minutes which resulted in a change in color to vivid yellow. The spectrum of this stone in the UV, visible, near infrared, and infrared spectra showed no unusual absorption lines that are not seen in natural diamond stones. Specifically, the normal irradiation signatures, such as the GR1 line at 741 nm and the H1b and H1c lines arising from a combination of irradiation and heat treatment, were absent.

Example V

A Type IIa natural rough diamond weighing 3.06 carats and brown in color was placed inside a pill made by pressing high-purity graphite. The diamond was annealed at ~60 kbars and 2300° C. for ~6 minutes. Visual examination of the recovered diamond showed that the color had changed to pink.

Example VI

A Type IIa natural polished diamond weighing 1.40 carats and brown in color was placed inside a pill made by pressing high-purity graphite. The diamond was annealed at ~60 kbars and 2450° C. for ~6 minutes. Visual examination of the recovered diamond showed that the color had changed to light pink.

Example VII

A Type IIa natural diamond (Stone No. K11) weighing 1.22 carats (244 milligrams) and being steel brown in color was embedded inside a graphite pill made by pressing high-purity graphite powdered. The diamond was annealed at ~80 kbars and 2300° C. for 18 minutes. The diamond crystal was recovered and visual examination showed that its color had changed to clear or colorless. The change in color became more evident after polishing flats on the surface of the annealed diamond.

Example VIII

A Type Ia natural diamond (Stone No. F 1816) weighting 1.05 carats (210 milligrams) and light brown in color was placed inside a pill made by pressing high-purity sodium chloride powder. The diamond was annealed at ~80 kbars and ~2400° C. for 18 minutes. Visual examination of the recovered diamond showed that the color had changed to golden yellow.

Example IX

A Type Ia natural diamond (Stone No. K38) weighing 0.80 carats (160 milligrams) and medium brown in color was placed inside a pill made by pressing high-purity sodium chloride powder. The diamond was annealed at ~77 kbars and ~1900° C. for 18 minutes. Visual examination of the recovered diamond showed that there was no change in color. The diamond was annealed again at ~79 kbars and ~2050° C. for 18 minutes which resulted in a change in color to light yellow. The diamond was annealed for a third time at ~79 kbars and 2200° C. for 18 minutes which resulted in a change in color to greenish-golden yellow. The spectrum of this stone in the UV, visible, near infrared, and infrared spectra showed no unusual absorption lines that are not seen in natural diamond stones. Specifically, the normal irradiation signatures, such as the GR1 line at 741 nm and the H1b and H1c lines arising from a combination of irradiation and heat treatment, were absent, as well as was an absorption peak in the near infrared at 985 nm that had been previously seen by GIA laboratory in a greenish-yellow stone that had been "treated." *Gems and Gemology*, supra.

Example X

A Type Ia natural diamond (Stone No. K40) weighing 0.59 carats (118 milligrams) and dark brown in color was placed inside a pill made by pressing a mixture containing 96% high purity sodium chloride and 4% potassium nitrate powders. The diamond was annealed at ~80 kbars and 2300° C. for 18 minutes which resulted in a change in color to greenish-golden yellow. The spectrum of this stone in the UV, visible, near infrared, and infrared spectra showed no unusual absorption lines that are not seen in natural diamond stones. Specifically, the normal irradiation signatures, such as the GR1 line at 741 nm and the H1b and H1c lines arising from a combination of irradiation and heat treatment, were absent, as well as was an absorption peak in the near infrared at 985 nm that had been previously seen by GIA laboratory in a greenish-yellow stone that had been "treated." *Gems and Gemology*, supra.

Examples XI

Three Type Ia diamonds, K58-12, K58-61, and K58-62, weighing 0.158, 0.136, and 0.12 carats (31.6, 27.1, and 24 milligrams) with initial colors of light brown, dark brown, and dark brown, respectively, were placed inside a pill by pressing a high-purity graphite. The diamonds were IaA/B type with nitrogen present in A and B centers. However, in both the K58-61 and K58-62 diamonds, nitrogen was present mainly in B centers and these diamonds were therefore mainly Type IaB diamonds. The diamonds were annealed at 79 kbar and 2300° C. for 18 minutes. Visual examination of the recovered diamonds showed that K58-12 had changed to a deep yellow, K58-61 to a very light yellow, and K58-62 had changed to colorless.

Examples XII

Three Type Ia diamonds, K58-10, K59-40, and K59-60, weighing 0.132, 0.108, and 0.152 carats (26.4, 21.6, and 30.3 milligrams) with initial colors of light brown, brown, and brown, respectively, were placed inside a pill by pressing a high-purity graphite powder. K58-10 was a Type IaB diamond, whereas both K59-40 and K59-60 were Type IaA/B diamonds. The diamonds were annealed at 79 kbar and 2000° C. for 18 minutes. Visual examination of the recovered diamonds showed that K58-10 had become colorless, whereas both K59-40 and K59-60 had no change in color.

Examples XI and XII indicate that some Type Ia diamonds, particularly Type IaB diamonds, can be made colorless by annealing under high-pressure and high-temperature conditions.

Examples XIII–XXIII

Additional diamond samples were annealed by the procedures described above. The results of such annealing procedure, along with the previous examples, is set forth in the following table in which the temperatures and pressures reported are estimated values as is common in the HP/HT industry.

TABLE I

| Example No. | Stone No. | Diamond Type | Color Before Annealing | Medium | Pressure (Kbar) | Temperature (° C.) | Time (min) | Color After Annealing |
|---|---|---|---|---|---|---|---|---|
| 1 | 000511 | IIa | brown | graphite | 60 | 2450 | 6 | colorless |
| 2 | 001040 | IIa | brown | graphite | 60 | 2500 | 6 | colorless |
| 3 | 001265 | Ia | brown | graphite | 60 | 2550 | 8 | intense yellow |
| 4 | 001279 | Ia | brown | graphite | 60 | 2550 | 8 | vivid yellow |
| 5 | 000215 | IIa | brown | graphite | 60 | 2300 | 6 | pink |
| 6 | 001006 | IIa | brown | graphite | 60 | 2450 | 6 | light pink |
| 7 | K11 | IIa | steel brown | graphite | 80 | 2300 | 18 | colorless |
| 8 | F1816 | Ia | light brown | sodium chloride | 80 | 2400 | 18 | orange |
| 9 | K38 (1st run) | Ia | medium brown | sodium chloride | 77 | 1900 | 18 | medium brown |
|  | K38 (2nd run) | Ia | medium brown | sodium chloride | 79 | 2050 | 18 | light yellow |
|  | K38 (3rd run) | Ia | light yellow | 99% NaCl + 1% KNO$_2$ | 79 | 2200 | 18 | greenish-golden yellow |
| 10 | K40 | Ia | dark brown | 96% NaCl + 4% KNO$_3$ | 80 | 2200 | 18 | greenish-golden yellow |
| 11 | K58-12 | IaA/B | light brown | graphite | 79 | 2300 | 18 | deep yellow |
|  | K58-61 | IaA/B | dark brown | graphite | 79 | 2300 | 18 | very light yellow |
|  | K58-62 | IaA/B | dark brown | graphite | 79 | 2300 | 18 | colorless |
| 12 | K58-10 | IaB | light brown | graphite | 79 | 2000 | 18 | colorless |
|  | K59-40 | IaA/B | brown | graphite | 79 | 2000 | 18 | brown |
|  | K59-60 | IaA/B | brown | graphite | 79 | 2000 | 18 | brown |
| 13 | K18 | Ia | light brown | graphite | 80 | 2300 | 20 | pale green |
| 14 | K35 | Ia | light brown | graphite | 80 | 2300 | 18 | yellow |
| 15 | K37 (1st run) | Ia | light brown | graphite | 77 | 1900 | 18 | light brown |
|  | K37 (2nd run) | Ia | light brown | sodium chloride | 80 | 2400 | 12 | yellow |
| 16 | K45 | Ia | dark brown | graphite | 80 | 2300 | 17 | yellow |

TABLE I-continued

| Example No. | Stone No. | Diamond Type | Color Before Annealing | Medium | Pressure (Kbar) | Temperature (° C.) | Time (min) | Color After Annealing |
|---|---|---|---|---|---|---|---|---|
| 17 | K43 | Ia | light brown | sodium chloride | 80 | 2200 | 18 | light greenish yellow |
| 18 | K44 | Ia | light brown | sodium chloride | 80 | 2300 | 18 | light yellow |
| 19 | F1813 (1st run) | Ia | light brown | sodium chloride | 80 | 2300 | 18 | light yellow |
|  | F1813 (2nd run) | Ia | light yellow | sodium chloride | 80 | 2400 | 18 | brownish yellow |
| 20 | F1814 (1st run) | Ia | very light brown | sodium chloride | 80 | 2200 | 18 | light yellow |
|  | F1814 (2nd run) | Ia | light yellow | sodium chloride | 80 | 2400 | 18 | orange |
| 21 | K56-1 | IIa | light brown | sodium chloride | 80 | 2300 | 18 | colorless |
| 22 | K66-A | IIb | light steel brown | graphite | 79 | 2300 | 18 | light blue |
| 23 | K61-11B | IIa | medium brown | graphite | 80 | 2300 | 18 | light pink |

We claim:

1. A method for changing the color of a colored Type II natural diamond comprising:
   a. creating a reaction cell comprising a colored Type II natural diamond in a pressure-transmitting medium
   b. exposing said reaction cell to elevated pressure and elevated temperature for a time sufficient to change the color of the diamond; and
   c. recovering said diamond.

2. The method of claim 1, wherein said elevated pressure ranges from about 10 to about 200 kilobars and said elevated temperature ranges from about 1500° C. to about 3500° C.

3. The method of claim 2, wherein said pressure ranges from about 20 to about 80 kilobars.

4. The method of claim 2, wherein said pressure ranges from about 50 to about 90 kilobars.

5. The method of claim 2, wherein said temperature ranges from about 1800° C. to about 2700° C.

6. The method of claim 2, wherein said pressure ranges from about 50 to about 70 kilobars and said temperature ranges from about 2200° C. to about 2700° C.

7. The method of claim 2, wherein said pressure ranges from about 70 to 90 kilobars and said temperature ranges from about 1800° C. to about 2500° C.

8. The method of claim 2, wherein the reaction cell is exposed to elevated pressure and elevated temperature in the graphite-stable range of the carbon-phase diagram for a time sufficient to change the color of the diamond without significant graphitization of the diamond.

9. The method of claim 1, wherein the reaction cell is exposed to elevated pressure and elevated temperature above the diamond-graphite equilibrium and within the diamond-stable range of the carbon-phase diagram.

10. The method of claim 1, wherein said colored Type II natural diamond is a Type IIa or Type IIb diamond.

11. The method of claim 1, wherein the recovered diamond is colorless.

12. The method of claim 1, wherein the recovered diamond has a color selected from the group consisting of pink, red, yellow, green, blue, purple, orange and a color combination thereof.

13. The method of claim 1, wherein said recovered diamond is subjected to steps (a), (b), and (c) a plurality of times.

14. The method of claim 1, wherein said pressure-transmitting medium is thermally and chemically stable at elevated-pressure and elevated-temperature conditions and is selected from the group consisting of a salt, a carbide, a nitride, a bozide, an oxide, graphite, and combinations thereof.

15. The method of claim 14, wherein said pressure-transmitting medium is selected from the group consisting of sodium chloride, sodium iodide, sodium bromide, potassium chloride, potassium iodide, potassium bromide, calcium chloride, calcium iodide, calcium bromide, boron nitride and boron carbide.

16. The method of claim 14, wherein said pressure-transmitting medium is selected from the group consisting of magnesium oxide, calcium oxide, and mixtures thereof.

17. The method of claim 14, wherein said pressure-transmitting medium is graphite.

18. The method of claim 1, wherein said pressure-transmitting medium is a powder.

19. The method of claim 1, further comprising the step of melting and solidifying the pressure-transmitting medium to form a pill.

20. The method of claim 1, wherein said elevated temperature and said elevated pressure are maintained from 30 seconds to 96 hours.

21. The method of claim 20, wherein said elevated temperature and said elevated pressure are maintained from 5 minutes to 24 hours.

22. The method of claim 21, wherein said elevated temperature and said elevated pressure are maintained from about 5 minutes to about 1 hour.

23. The method of claim 1, wherein said colored Type II natural diamond has a brownish color.

24. The method of claim 1, wherein the recovered diamond is pink, red, blue, or a color combination thereof.

25. The method of claim 1, wherein the colored Type II natural diamond has a weight ranging from about 0.1 to 100 carats.

26. The method of claim 1, wherein the colored Type II natural diamond is cut and polished when placed in said pressure-transmitting medium.

27. The method of claim 1, wherein the recovered diamond is subsequently cut and polished.

28. The method of claim 27, wherein the cut is selected from the group consisting of Brilliant, Old Miners, Old European, Baguette, Triangle, Emerald, Ellipitical, and Free Form.

29. The method of claim 28, wherein said Old European cut comprises Perruzi and Mazarin; said Ellipitical cut comprises Pear, Heart, Oval and Marquise; and said Free Form cut comprises Scimitar, Briollete, State and Nation.

30. The method of claim 1, wherein the recovered diamond has a Gemological Institute of America Clarity Grade of about FL, IF, VVS1, VVS2, VS1, VS2, SI1 or SI2.

31. The method of claim 12, wherein the recovered diamond has a Gemological Institute of America color grade selected from the group consisting of D, E, F, G H, I, J, K, L, M, N, O, P, Q and R.

32. A method for changing the color of a colored Type II natural diamond comprising:

a. creating a reaction cell comprising a colored Type II natural diamond in a pressure-transmitting medium;

b. exposing said reaction cell to elevated pressure and elevated temperature for a time sufficient to change the color of the diamond; and c. recovering said diamond, wherein said recovered diamond is of at least ½ carat in size and ready for to be cut and polished for jewelry, or fabrication into devices.

33. The method of claim 32, wherein said elevated pressure ranges from about 10 to about 200 kilobars and said elevated temperature ranges from about 1500° C. to about 3500° C.

* * * * *